United States Patent
Cha et al.

[11] Patent Number: 6,096,604
[45] Date of Patent: Aug. 1, 2000

[54] PRODUCTION OF REVERSED FLASH MEMORY DEVICE

[75] Inventors: Cher Liang Cha; Anqing Zhang; Zhifeng Joseph Xie; Eng Fong Chor, all of Singapore, Singapore

[73] Assignees: Chartered Semiconductor Manufacturing Ltd; Nanyang Technological University of Singapore; Institute of Microelectronics, all of Singapore, Singapore

[21] Appl. No.: 09/366,739

[22] Filed: Aug. 4, 1999

[51] Int. Cl.[7] .......................... H01L 21/336; H01L 29/72; H01L 21/8239
[52] U.S. Cl. .......................... 438/259; 438/257; 438/266; 438/294; 438/296; 257/288; 257/315; 257/318
[58] Field of Search ........................ 438/257, 258, 438/259, 211, 270, 272, 334, 353, 370; 257/288, 296, 313, 318, 320, 315

[56] References Cited

U.S. PATENT DOCUMENTS

| | | | |
|---|---|---|---|
| 4,111,720 | 9/1978 | Michel et al. | 148/1.5 |
| 4,957,877 | 9/1990 | Tam et al. | 437/43 |
| 4,975,383 | 12/1990 | Baglee | 437/43 |
| 5,371,704 | 12/1994 | Okazawa | 365/185 |
| 5,479,368 | 12/1995 | Keshtbod | 365/185.01 |
| 5,488,244 | 1/1996 | Quek et al. | 257/314 |
| 5,587,332 | 12/1996 | Chang et al. | 437/43 |
| 5,851,881 | 12/1998 | Lin et al. | 438/261 |
| 5,929,479 | 7/1999 | Oyama | 257/315 |

OTHER PUBLICATIONS

Kato et al., "A Shallow–Trench–Isolation Flash Memory Technology with a Source–Bias Programming Method", IEDM, pp. 177–180, 1996.

Primary Examiner—Matthew Smith
Assistant Examiner—Lex H. Malsawma
Attorney, Agent, or Firm—George O. Saile; Rosemary L.S. Pike

[57] ABSTRACT

This invention relates to the new reversed flash memory device which has improved electrical performance, yield and reliability because of better control of the dielectric interfaces resulting from first making the poly 2 control gate within the silicon substrate. The reverse structure is novel, as are the described process methods for forming the reverse stacking order.

Shallow trenched isolation (STI) is first formed in the p-silicon substrate and encompasses the poly 2 control gate region; then the interpoly dielectric is grown/deposited on that single crystal silicon substrate. The floating poly 1 is formed on top of this uniform interpoly dielectric that has well-controlled surface smoothness. The tunnel oxide layer is formed on the floating poly 1 layer, and the source/drain is implanted on a straddling additional poly layer. There are fewer edges and associated stress weaknesses in the dielectric breakdown of both the reversed interpoly dielectric and the floating tunnel oxide. The results are improved electrical quality and more acceptable electrical parameters, including reversed flash memory devices with gate length dimensions below 0.35 microns.

41 Claims, 4 Drawing Sheets

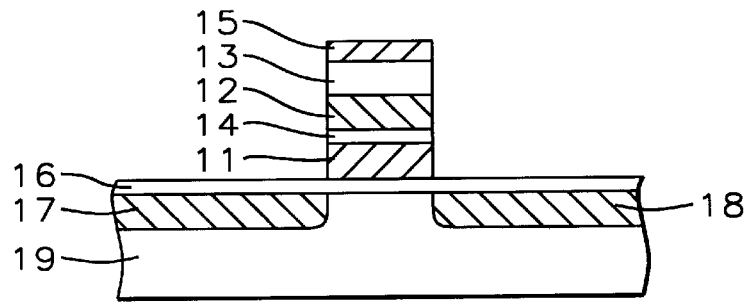
*FIG. 1 - Prior Art*
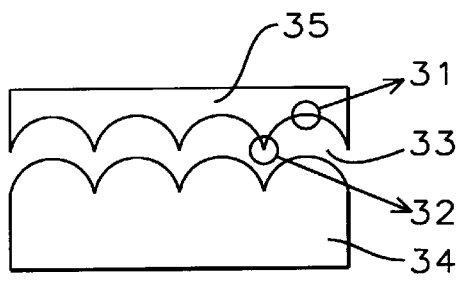
*FIG. 2a - Prior Art*
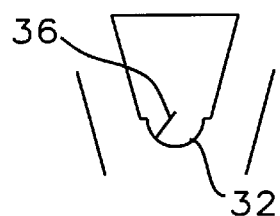
*FIG. 2b - Prior Art*
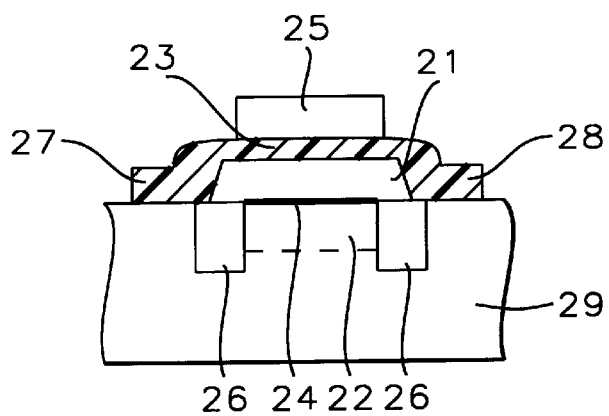
*FIG. 3*

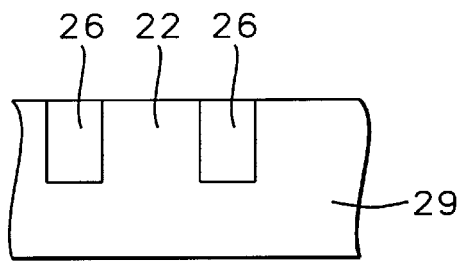
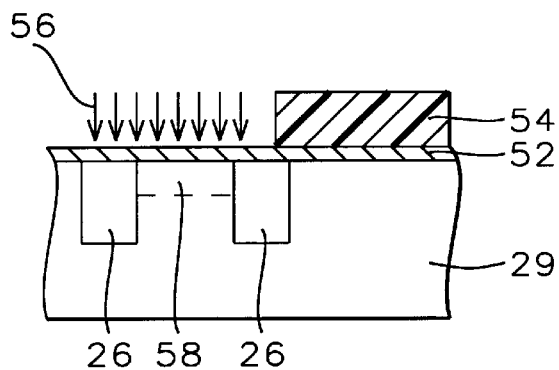
FIG. 4  FIG. 5
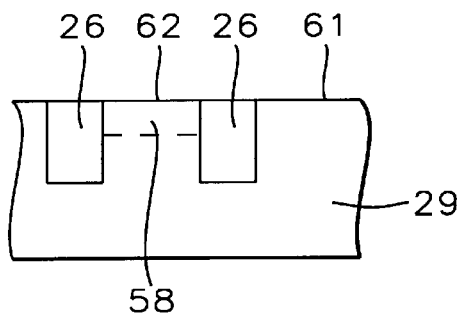
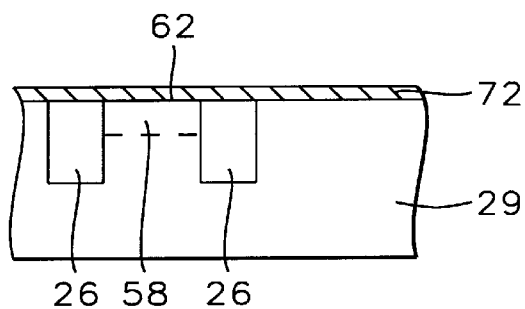
FIG. 6  FIG. 7
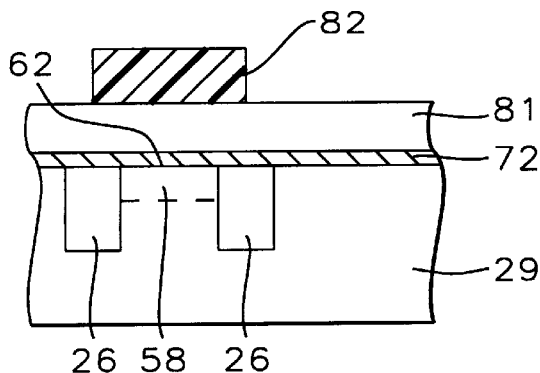
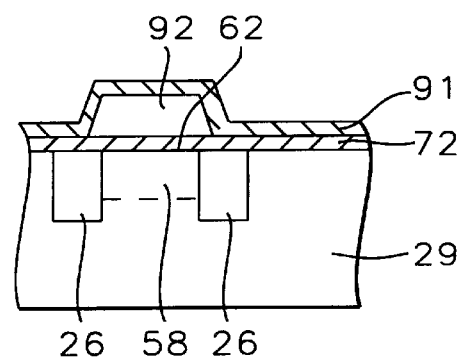
FIG. 8  FIG. 9

PRODUCTION OF REVERSED FLASH MEMORY DEVICE

BACKGROUND OF THE INVENTION

(1) Field of the Invention

This invention relates to a new reversed flash memory device. This new reversed flash memory device has improved electrical performance, yield and reliability due to better control of the dielectric interfaces within the reversed flash memory device. This better control is achieved by first creating the poly 2 control gate in the silicon substrate.

(2) Description of the Prior Art

The flash Electrically-Erasable Programmable Read-Only Memory (EEPROM) device is so named because the contents of all the memory array cells can be erased simultaneously through the use of an electrical erase signal. The flash refers to the fact that the cells can be erased much more rapidly (1 or 2 seconds, compared to the 20 minutes required to erase a UV-EPROM). Large size memories are at this time available that offer a byte-by-byte erase capability.

The erasing mechanism in flash EEPROM's is Fowler-Nordheim tunneling off of the floating gate to drain region. Programming of the floating gates is carried out in most flash cells by hot-electron injection into the gate. Floating gate EEPROM's incorporate a separate select transistor in each cell to allow for individual byte erasure while flash memories forego the select transistor in order to obtain bulk erasure capabilities.

Most present day flash-EEPROM cells use a double-poly structure. The upper poly forms the control gate or the word lines of the structure, while the lower poly is the floating gate. The gate oxide is approximately 10 nm. thick (physical thickness), the interpoly dielectric is an oxide/nitride/oxide composite film approximately 20 nm. thick (physical thickness). Part of the structure can be a special, software controlled erase gate which is instrumental in assuring that the floating gate is not over-erased.

Flash EEPROMS can be seen to combine the advantages of UV-erasable EPROM's and floating gate EEPROM's. They offer the high density, small die size, lower cost and hot electron writability of EPROM's, together with the easy erasability, on-board re-programmability and electron-tunneling erasure features of EEPROM's.

The reliability of the flash memory device is often dependent on the interfacial conditions between the tunneling oxide and poly 1, as well as between the interpoly dielectric and the adjacent layers. For example, the inherent surface roughness of the deposited poly 1 often causes a rough, edgy surface upon which to grow/deposit the interpoly dielectric.

The poly 1 layer for the floating gate is usually deposited first (by implant doping). This prior-art process methodology causes the existence of non-uniform regions of high dielectric field stress in the interpoly dielectric, which accelerates the time-dependent breakdown of the interpoly dielectric. A similar assessment can be made about any dielectric weakness in the thin tunneling dielectric layer constructed between the source and drain of any transistor used for flash memory devices.

FIG. 1 shows the Prior Art construction of a flash memory cell device. The control gate 12 is labeled poly 2, the floating gate 11 is labeled poly 1. Imperfect interfaces caused by poly 1 surface roughness severely impair the integrity of the device dielectrics during plasma chamber electrode charging and/or device stress testing of the electrical parameters. The source 17 and drain 18 are located in the single silicon substrate 19, the interpoly layer 14 is seen between poly 1 and poly 2. The thin tunneling layer 16 is constructed on the single crystal substrate above the source and drain. The connecting tab to the poly 2 (the control gate) is made with the tungsten silicide layer 13 and the poly cap 15.

FIG. 2 shows a physical and mathematical model of the rough surface created by LPCVD of poly 1 layer 11 (FIG. 1), which is characteristic of the conventional (Prior Art) flash memory device structure. The mathematical model is based on the equation $E_{edge}/E_{plane}=((1+(r/T_{ono}))\ )/(r/T_{ono})$. The electric field increases with decreasing distance between two charge points. The equation is a ratio relating the E-field at the convex edge 32 to that in the planar edge face 31, where r is the radius 36 of the convex edge 32 and $T_{ONO}$ is the period/distance between roughness cycles within the interpoly layer 33 of ONO. Layer 34 is the layer of poly 1 (the Prior Art floating gate), layer 35 is the layer poly 2 (the Prior Art control gate). The equation demonstrates the effect of sharp (small "r") imperfections in the semiconductor surface. A small radius "r" makes the ration $r/T_{ONO}$ small, since the ratio $E_{edge}/E_{plane}$ is inversely proportional to the ratio $r/T_{ONO}$ the small "r" (sharp surface irregularities) results in a large value for the ratio $E_{edge}/E_{plane}$. This indicates that surface irregularities in the surface of the poly 1 layer 32 result in creating points of high electric field concentration in the interpoly ONO layer 33. Surface irregularities and therefore points of high electric field concentration are further emphasized when subjecting the surface to plasma charging or electrical stressing. The result is a severe performance degradation of the Prior Art flash memory device.

U.S. Pat. No. 5,479,368 to Keshtbod shows a flash cell with an interpoly dielectric formed on a substrate and a vertically floating gate.

U.S. Pat. No. 4,957,877 to Tam et al shows a method for forming a flash dual cell with doped regions under a finger of a floating gate.

U.S. Pat. No. 5,587,332 to Chang et al. shows a flash memory cell with polysilicon control gate on top of the interpoly dielectric layer, and the source/drain implanted in the silicon substrate, which is the conventional stacking structure.

BRIEF SUMMARY OF THE INVENTION

A principle e object of the present invention is to provide for a new reversed flash memory device structure.

A new reversed flash memory device structure is created by first growing/depositing poly 2, the control gate within the single crystal silicon. The control gate is grown using shallow trench isolation (STI) resulting in a silicon substrate surface that is essentially free of surface roughness and/or edginess. The substrate surface provides the basis for the remaining layers, including the formation of the source and drain.

Another object of the invention is to provide a process methodology for making the new device structure of the reverse flash memory device. The sequence of processing steps moves from poly 1-poly 2-source/drain to poly 2-poly 1-source/drain, with growth/deposition of the suitable dielectric layers between the poly layers to establish the floating gate and the tunnel effect at the source and drain, in that order.

A further objective of this invention relates to fabrication of flash devices with smaller dimensions, e.g. less than 0.35 micron gate length. Sub-micron construction of flash memory devices experiences considerably difficulty using the conventional flash stack. The new reversed structure of the present invention reduces corners (the corners are blocked by the STI). The channel length within the flash memory device is therefore strictly determined by photolithography. There are no short channel device effects to limit the control gate length during fabrication at sub-micron dimensions.

Yet another objective of reversed memory cell devices is to increase the gate coupling coefficients and to reduce programming voltages to more favorable values.

BRIEF DESCRIPTION OF THE DRAWINGS

In the accompanying drawings forming a material part of this description, there is shown:

FIG. 1 is a cross-sectional view of a Prior Art flash memory cell.

FIG. 2a–2b show a diagram and associate mathematical model of an imperfect inter/face between poly 1 and poly 2.

FIG. 3 is a cross-sectional view of the reversed flash memory cell.

FIG. 4 is a cross section of a substrate with shallow trench isolation areas.

FIG. 5 shows the formation of a screen oxide, photoresist deposition/patterning/etching and the deposition of the n-dopant (for the formation of the poly 2 control gate).

FIG. 6 illustrates the smooth substrate surface following the removal of the photoresist and screen oxide.

FIG. 7 shows the formation of a layer of interpoly dielectric together with peripheral gate oxide and activation of the dopants in the control gate.

FIG. 8 shows the deposition of a layer of poly 1 (for the formation of the floating gate) and the deposition/patterning/etching of a photoresist mask.

FIG. 9 shows the results of a dry etch applied to the surface of the poly 1 and the photoresist.

DESCRIPTION OF THE PREFERRED EMBODIMENTS

Figure 10:
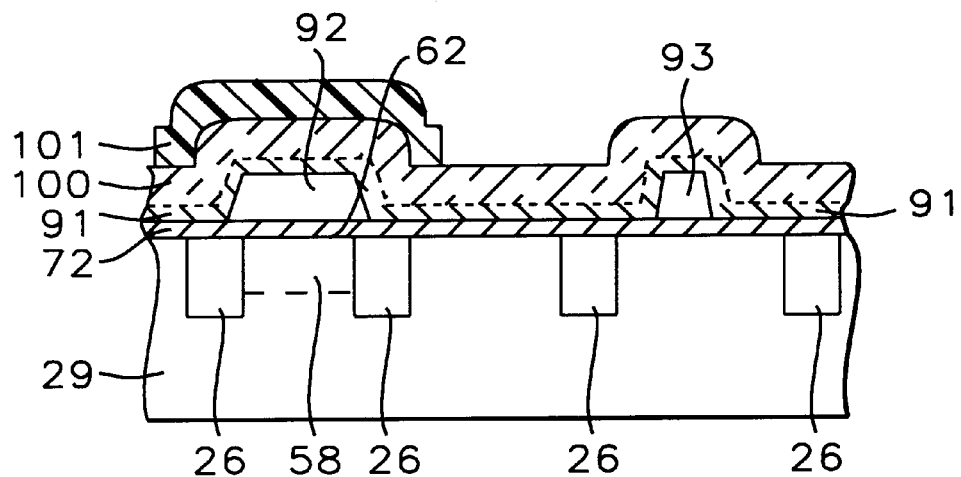
FIG. 10 shows the deposition of a layer of undoped poly or a layer of sputtered silicon (annealed) and the depositing/patterning/etching of photoresist.

Flash memory combines the benefits of the EPROM's low cost with the EEPROM's ease of erasure and reloading of the stored data and programs. Flash chip architectures exist that allow variable size of partitions of code and data size on one chip. Flash memory is a fast-growing market, being used in digital cameras, PDA'S, voice recorders, solid-state disks, and cellular-phone embedded memory arrays, memory card products, and other hand-held computer/network applications. Its major attraction is first-page-mode, fast-random access performance at less than 100 nanoseconds.

FIG. 3 is the cross-sectional view of the reversed flash memory device of the present invention. Shown are the floating gate poly 1 layer 21 on top of the control gate poly 2 layer 22, the latter being constructed within the single crystal substrate 29. The shallow trench isolation regions 26 define the region 22 for the control gate poly 2. The source region 27 and drain region 28 are constructed in another polysilicon layer 23 deposited over the poly 1 layer 21. The interpoly layer 24 is shown to be fabricated on the smooth surface of the silicon substrate 29. The photoresist 25 is shown at the top of the stack, this photoresist 25 is used to mask the n-dopant during the fabrication of the source (27) and drain (28) regions.

FIG. 4 shows a cross section of the silicon substrate 29, the Shallow Trench Isolation (STI) regions 26. The area 22 between the STI areas 26 defines the area where the poly 2 will be implanted and the control gate will be formed. The novelty of the present invention stems from the need to achieve more integrity in the electric field strength within the thin interpoly (24) film dielectrics of the flash memory device (refer to FIG. 2). This requires that the formation of points or concentration of high electric field strength within the interpoly dielectric must be avoided. This integrity can be achieved by reversing the flash memory structure, beginning the fabrication of the flash cell with the n-dopant control poly 2 region 22 isolated by shallow trenches 26 in the p-type single crystal substrate 29. This procedure results in a surface of the silicon substrate that is smoother, in addition further smoothing of the surface occurs via the impact of amorphization during doping of the poly 2 (22, FIG. 4). A smoother surface results in fewer undesired convex edges.

During the creation of the STI (26, FIG. 4), use is made of CMP in order to remove excess oxide at the trenches that have been created. A nitride/oxide protective layer is available on the silicon islands (where the devices will be build) that acts as the oxide-CMP stop layer. The nitride/oxide layer protects the silicon surface from the mechanical grinding actions of CMP.

FIG. 5 shows a cross section after the formation of a layer 52 of screening oxide and the depositing/patterning and etching of a layer 54 of photoresist. Also shown is the implant 56 of Sb to form the n-doped layer 58, that is the poly 2 control gate. Layer 52 of screen oxide is between about 300 and 500 Angstrom thick. The layer 54 of photoresist is between about 0.8 and 1.2 um thick.

The doping to create the n-doped layer 58 (FIG. 5) is performed by implanting antimony at a dose between about $10^{15}$ and $10^{16}$ atoms/cm$^2$ with an energy between about 200 and 250 KeV said doping to proceed over a period of between about 300 and 360 seconds, these parameters typically apply for a batch implantation of 13 wafers. The dopant typically penetrates about 1500 Angstrom into the silicon whereby further the typical depth of the STI is about 0.15 um and the width of the STI that is overlaid by the photoresist is about 0.12 um.

FIG. 6 shows the results of the removal of screen oxide layer 52 (FIG. 5) and the removal of the photoresist (54, FIG. 5). Due to the indicated reversal in the processing steps in forming the flash memory cell, the top surface 62 of the poly 2 layer, that is used for the formation of the other layers within the cell, is considerably improved in smoothness and can, in addition, withstand subsequent high temperature processing.

FIG. 7 shows the results of the thermal growth of a layer 72 of high temperature oxide (HTO) followed by oxide annealing at high temperatures (850 degrees C.). The surface of the oxide created in this manner will be better than conventional (deposited) stacked dielectric, the latter typically poses problems such as interfacial effects. The interpoly layer 72 in the reversed cell can be made of a high-temperature oxide HTO, including a densification step consisting of subsequent oxygen annealing at 850 degrees. It is well known in the art that HTO generates a uniform thin-film dielectric that exhibits high electric breakdown strength. The indicated processing steps of high temperature oxidation and oxygen annealing result in the formation of the interpoly dielectric layer 72 and a layer of peripheral gate oxide in addition to the activation of the previously implanted dopants.

The HTO on doped poly 2 (72, FIG. 7) will, as is well known in the art, be thicker than the HTO that is grown on other, undoped silicon substrate layers such as the peripheral gate oxide. Layer 72 typically is between about 100 and 200 Angstrom thick, the peripheral oxide typically is between about 60 and 100 Angstrom thick.

The process parameters for the HTO growth are as follows: temperature between about 800 and 900 degrees C., time between about 10 and 15 minutes, the process is performed in a thorium (Th) atmosphere that is about 10% steam diluted in $O_2$ combined with a Th with $N_2$ atmosphere.

The processing conditions for the HTO oxygen annealing/activation of the dopants are as follows: the temperature is between about 800 and 900 degrees C., for a time of about 30 minutes. This anneal results in (the advantages of) a reflow of the grown HTO and in the activation of the dopants.

In a conventional flash memory stack, the interpoly is often made of a multi-layer ONO dielectric (oxide-nitride-oxide). ONO scaling is difficult below 20 nanometers, however, because while thinning down both the nitride and the bottom oxide to reach below 20 nanometers of ONO, the top oxide should be in the range of 6–10 nanometers. ONO processing steps involve cleaning by oxide etching and re-oxidizing the LPCVD nitride layer during the growth of the gate oxide. The reverse memory cell structure permits a simplified sequence of process steps using HTO for the interpoly layer.

The processing conditions for the poly1 dopant implant are as follows: dopants P or As, dose about $10^{15}$ atoms/cm$^2$, energy 10 to 15 KeV. The benefit of this blanket implant is that no specific mask is required.

FIGS. 8 and 9 show, after the completion of the high temperature oxidation, the formation of the floating gate. The polysilicon layer 81 that is deposited on the interpoly dielectric 72 (FIG. 7) becomes the flash poly 1 and subsequently the floating gate. FIG. 8 shows the deposition of a layer 81 of polysilicon and the creation of a photoresist mask 82 positioned such as to permit a dry etch of the layer 81 thereby forming the poly 1 floating gate. The deposited layer 81 of poly is between about 1250 and 1500 Angstrom thick.

Referring to FIG. 9, the poly 1 structure 92 is illustrated with a sloping profile; floating gate 92 is created by a dry etch of polysilicon layer 81 (FIG. 8). A sloping profile for poly 1 gate 92 is desired on the floating poly 1 to intensify the electric field at the corners of the floating gate. The next step is to remove the photoresist 82 (FIG. 8) by means of dry oxidation thereby forming the tunneling-oxide 91, which is a very thin film of oxide needed between the source and drain of a flash memory device.

The sloping edges of the floating gate 92 offer a number of advantages, as follows:

sharp angles of the gate structure readily result in tunnel oxide breakdown at the corners of the gate due to the increased electromagnetic field in these regions the absence of sharp edges or angles also allows for a better reflow and improved uniformity of coverage by the overlying poly or by sputtered silicon the structure of the invention as shown also allows for easier programming of the device since the electric field is higher at the source/drain regions of the device finally, it is easier to etch away the overlying poly-silicon or to sputter silicon in the regions that house the peripheral transistors.

The tunneling oxide layer 91 serves as the gate oxide layer and further provides increased resistance to hot carriers. The layer 91 is typically between about 60 and 80 Angstrom thick for 0.35 um rule devices. Layer 91 is formed using LPCVD of TEOS or LPCVD of $Ta_{2O5}$ or again applying HTO.

Figure 11:
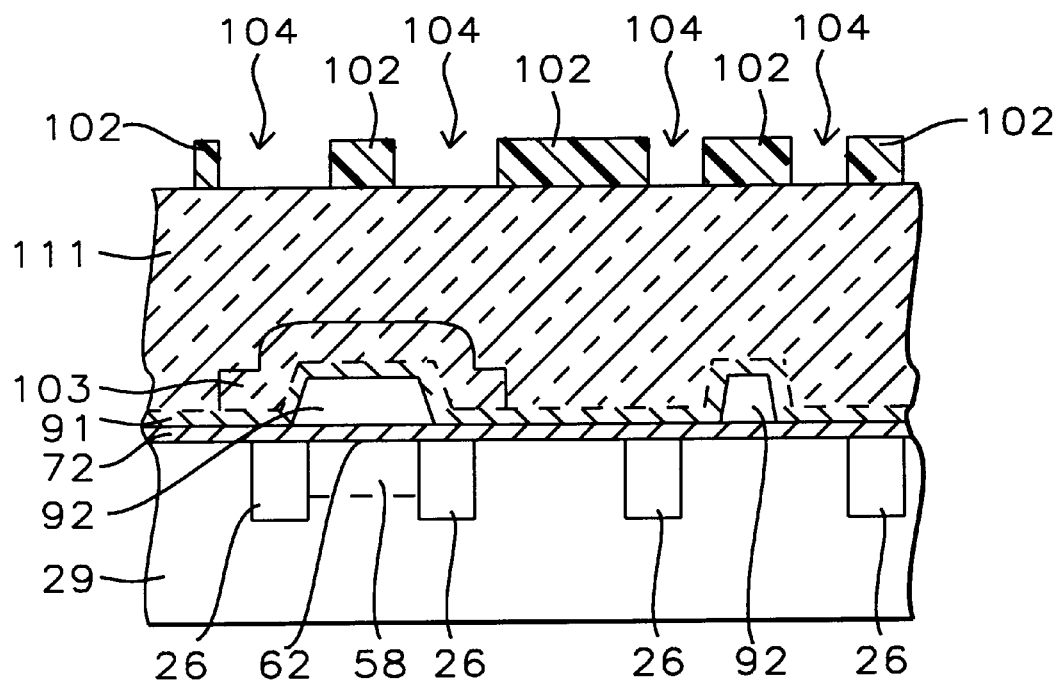
FIG. 11 shows the deposition of a layer of CVD oxide and the depositing/patterning/etching of photoresist.
Figure 12:
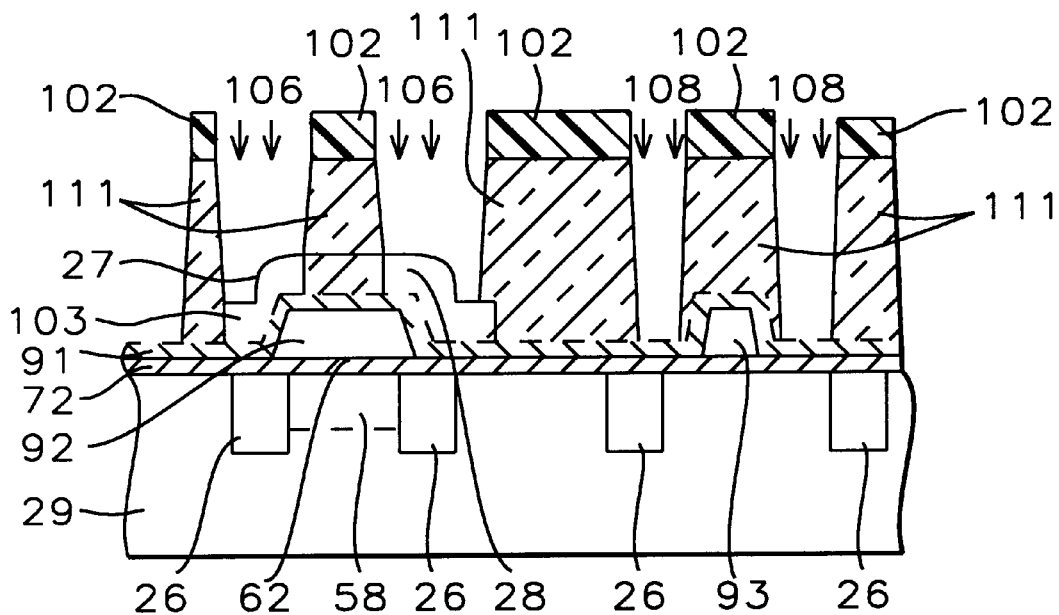
FIG. 12 shows a cross sectional view of the completed reverse flash memory cell and the peripheral transistors after the layer of CVD oxide has been etched and during the implantation of the source/drain regions.

FIGS. 10 through 12 show that the final processing step in fabricating the reverse cell is the formation of the source and drain regions of the flash memory cell.

FIG. 10 shows the deposition of a layer 100 of undoped polysilicon on top of the layer of tunneling oxide 91. In addition a layer of photoresist (not shown in its entirety) is deposited over the layer 100 of undoped polysilicon, this layer of photoresist is patterned, exposed and etched such that a mask 101 of photoresist is formed, this mask 101 selectively protects the underlying undoped poly during removal of the unprotected undoped poly layer or sputtered silicon. This protection assures that the undoped poly will not be removed in the area that is above and aligned with the reverse flash memory cell including the STI's of the cell. Layer 100 of undoped poly is typically between about 0.1 and 0.3 um thick. It can be formed by blanket implant of p-type impurities or by in-situ implant of $B_2O_3$, preferably a $BF_2$ implant with a density of between about $10^{11}$ and $10^{12}$ atoms/cm$^2$ at an energy of between about 10 and 15 KeV. Layer 101 is typically between about 0.8 and 1.2 um thick.

FIG. 11 shows the results after the layer 100 (FIG. 10) of undoped poly or sputtered silicon is, protected by the etched photoresist layer 101 (FIG. 10), etched thereby forming an etched layer 103 of undoped poly superimposed over the reverse flash memory structure. FIG. 11 further shows the deposition of a layer of CVD oxide 111 together with the creation of a pattern of photoresist 102. The latter two steps are required as preparation for the implantation of the n-dopant into the undoped poly 100 (FIG. 10). It is clear from FIG. 11 that the photoresist pattern 102 is such that the areas 104 in between the pattern are above and aligned with the areas of the reversed memory cell and its surrounding peripheral area where source/drain regions are to be implanted.

FIG. 12 shows the results of the etching of the CVD oxide layer 111 (FIG. 11) thereby creating deep openings into the layer through which the source/drain regions can be implanted. FIG. 12 further shows the implantation 106 of the source/drain regions in the reversed flash memory cell in addition to the implantation 108 of the source/drain regions in the active peripheral areas surrounding the reversed flash memory cell. The source/drain regions of the reversed flash memory cell are highlighted by 27 and 28 respectively, the source/drain of the active peripheral areas are, for simplicity of presentation, not highlighted.

The undoped poly (103) as shown in FIG. 12 or the sputtered silicon at the source/drain regions may be etched away resulting in thinner poly or silicon in these areas. This however is not critical because good results can be obtained by having shallow junctions combined with lower leakage.

The thickness of layer 111, FIG. 11, can be accommodated by either performing an oxide etchback or by performing an oxide CMP after which an opening is etched to perform the source/drain implant.

The implant conditions for the implant 106/108 shown in FIG. 12 are as follows: implant P or As with an energy of between about 10 and 30 KeV and a dose of about $10^{15}$ atoms/cm$^2$.

The photoresist that is shown in FIG. 12 is removed prior to source/drain implant in order to prevent sputtered residue of the photoresist to settle in the etched openings.

When the electric potential is applied between source and drain, some electrons tunnel into the floating gate. The amount of this electron charge deposited on the floating gate is determined by the poly 2 control gate, as is known from the physics of both the conventional cell and (this novel) reversed flash cell. The poly 2 control gate induces a voltage on the poly 1 floating gate which results in electron injection and tunneling from the source or drain regions.

The hot electron injection in a reverse gate flash memory cell is caused by the intense electromagnetic field in the source/drain regions that is caused by the sloping profile. In this manner, efficient tunneling of electrons into the poly1 can be realized using a smaller poly 2 control voltage.

Figure 13:
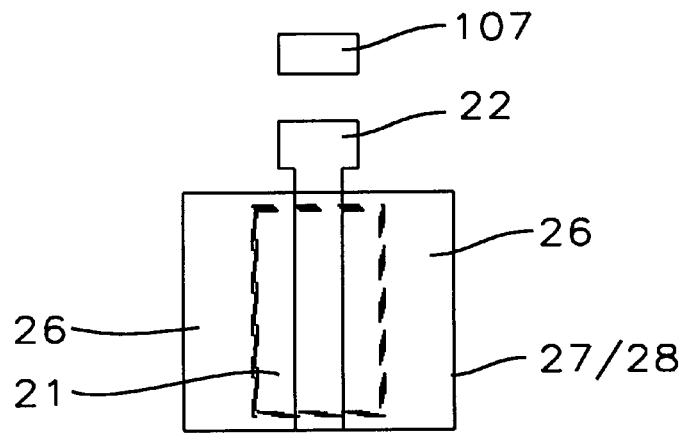
FIG. 13 shows a top view of the flash memory cell.

FIG. 13 shows a top view of the flash memory cell. Highlighted are 21 which is poly 2 (the embedded control gate), 22 which is poly 1 (or the floating gate), 26 which are the STI regions, 27/28 which are the source/drain regions and 107 which is the substrate tap. The electrical potential on the embedded poly 2 is applied to 22, the control gate shown in FIG. 13.

The substrate tap 107 forms the fourth terminal of the device and is formed on the p-type silicon substrate. It is electrically disconnected from the source/drain and from the embedded poly 2 and provides further electrical isolation.

Functionally, a group of cells or an entire flash IC can be electrically erased.

Some further advantages that result from the reverse cell as they relate to byte and sector erasing are:

Improved operational reliability due to improved interfacial conditions smaller devices are possible whereby the dimensions of the channel are limited only by available lithography technology an embedded device structure is realized.

The range of typical operational voltages that are applied to the cell for the various functional conditions are listed below. The function performed by the cell is listed on the first row of the table, in each column for the respective functions are listed in sequence the applied control gate voltage, the applied source voltage, the applied drain voltage and the substrate voltage. No voltage is applied to the floating gate during the operation of the cell. All number indicated are in volts.

|           | Programming | Erasing  | Read    |
|-----------|-------------|----------|---------|
| C.G.      | +(5–12)     | –(5–12)  | 2.5–5   |
| Source    | 0–5         | 0–5      | 0       |
| Drain     | 0–5         | 0–5      | 1–1.5   |
| Substrate | 0           | 0        | 0       |

The peripheral transistors are fabricated in conjunction with the flash cells, as shown on the right hand side of FIGS. 10, 11, and 12. There are several device types that can be placed on the peripheral area, and their detailed processing steps would be chosen to fabricate that particular structure. Peripheral transistors are used for memory control, including such functions as byte-sector size, error-correction code, bad-sector mapping, etc. These functions need not be provided on a reverse flash memory cell if they are provided on a companion flash memory control IC. Flash memory can also be embedded on micro-controller IC's in place of a ROM block. Regarding current state-of the art, 256 kilo-bytes of on-chip flash is commercially available. Flash memory is also available with the capacity to store one hour of audio recording on a single chip. All these applications will benefit from the simplified structure of a reversed flash memory cell.

Because flash memory cells use very thin oxides, its thin-dielectric reliability often degrades after extensive erase/write cycling, i. e. more than a few thousand cycles, and stored charge will leak away, thus destroying data bits or programmed instruction code. Reversed memory cells have been cycled into the range of 300,000 to one million cycles, and claims exist for 20-year data retention. The practical experimental data for the novel reversed flash memory cells shows erase/write cycle endurance of 10 and 15 years data retention.

Although the preferred embodiment of the present invention has been disclosed for illustrative purposes, those skilled in the art will appreciate that various modifications, additions and substitutions are possible without departing from the scope and spirit of the invention as disclosed in the accompanying claims.

What is claimed is:

1. A method for manufacturing a multilayer polysilicon device including peripheral transistors, said method comprising the steps of:

securing a semiconductor substrate;

forming shallow trench isolation (STI) regions within the surface of said substrate;

forming a control gate in the surface of said semiconductor substrate;

forming a floating gate on the surface of said semiconductor substrate; and forming source and drain regions within said multilayer polysilicon device.

2. The method of claim 1 wherein said forming a control gate in the surface of said semiconductor substrate is:

depositing a thin layer of screen oxide over the surface of said substrate;

depositing a layer of photoresist over said layer of screen oxide;

patterning said layer of photoresist;

etching said layer of photoresist;

doping the surface of said substrate;

removing said etched photoresist; and removing said thin layer of screen oxide.

3. The method of claim 2 wherein said shallow trench isolation regions are adjacent and functionally related STI regions.

4. The method of claim 2 wherein said patterning is creating a pattern wherein the photoresist approximately overlaying said STI regions and their intra-STI areas will be exposed upon inter-positioning of said pattern between a source of exposure and said layer of photoresist.

5. The method of claim 2 wherein said etching said layer of photoresist is: removing said photoresist from the surface of said thin layer of screen oxide, said removing to occur in the areas of said photoresist that are approximately above and align with adjacent and functionally related STI regions, furthermore said removing to occur above the intra-STI areas of said adjacent and functionally related intra-STI areas.

6. The method of claim 2 wherein said doping the surface of said substrate is: implanting of antimony at a dose in the range of $1 \times 10^{15}$ to $1 \times 10^{16}$ atoms/cm$^2$ and an energy in the range of 200 to 250 kilo-electron volts, said doping to proceed over a period of time between 300 and 360 seconds, thereby creating a control gate consisting of an intra-STI region of n-doped silicon material, said region extending into said substrate surface to a depth considerably less than the depth of said STI regions.

7. The method of claim 6 wherein said forming a floating gate on the surface of said semiconductor substrate is:

performing a high temperature oxide (HTO) deposition on the surface of said substrate thereby forming interpoly dielectric thereby further forming peripheral gate oxide;

performing a high temperature oxide annealing of said peripheral gate oxide thereby improving the interpoly dielectric furthermore improving said peripheral gate oxide;

implantation of dopant thereby further activating said antimony dopants;

depositing a layer of polysilicon on top of said oxide deposition;

depositing a layer of photoresist on top of said layer of polysilicon;

patterning and etching said layer of photoresist;

dry etching said layer of polysilicon including said interpoly dielectric further including said peripheral gate oxide; and performing a dry oxidation of said layer of polysilicon and said HTO.

8. The method of claim 7 wherein said performing a high temperature oxide deposition is: a deposition and annealing at between 800 and 900 degrees C. of a layer of oxide on the surface of said substrate, thereby forming the interpoly dielectric for said multilayer polysilicon device, thereby further forming the dielectric for said peripheral transistors, thereby furthermore activating said antimony dopants.

9. The method of claim 7 wherein said patterning of said layer of photoresist is: creating a pattern, whereby said photoresist is overlaying said control gate, furthermore partially overlaying said STI regions adjacent to and functionally related to said control gate.

10. The method of claim 7 wherein said etching said layer of photoresist is: creating a pattern of photoresist above and in line with said control gate, said pattern further partially extending over each of said STI regions adjacent to and functionally related with said control gate, thereby creating a pattern of photoresist on top of said layer of polysilicon.

11. The method of claim 7 wherein said dry etching said layer of polysilicon is: etching in accordance with said pattern of photoresist on top of said layer of polysilicon, thereby creating a pattern of polysilicon above and in line with said control gate with sloping sides, said sloping sides extending beyond the vertical dimensions of said control gate, thereby further removing said pattern of photoresist on top of said layer of polysilicon, thereby creating the floating gate of the multilayer polysilicon device.

12. The method of claim 7 wherein said performing a dry oxidation of said layer of polysilicon is: forming a thin layer of tunneling oxide, said tunneling oxide overlaying said layer of polysilicon, furthermore overlaying said peripheral gate oxide.

13. The method of claim 12 wherein said forming source and drain regions within said multilayer polysilicon device is:

depositing a layer of undoped polysilicon overlaying said layer of polysilicon furthermore overlaying said peripheral gate oxide;

depositing a first layer of photoresist over said undoped polysilicon;

patterning and etching said first layer of photoresist;

depositing a layer of CVD oxide over said patterned first layer of photoresist furthermore overlaying said peripheral gate oxide;

depositing a second layer of photoresist over said layer of CVD oxide;

patterning and etching said second layer of photoresist;

etching said layer of CVD oxide; and performing source and drain implant.

14. The method of claim 13 wherein said depositing a layer of undoped polysilicon is depositing a layer of undoped polysilicon on the surface of said layer of tunneling oxide.

15. The method of claim 13 wherein said depositing a first layer of photoresist is depositing a layer of photoresist on top of said layer of undoped polysilicon.

16. The method of claim 13 wherein said patterning said first layer of photoresist is: creating a pattern that inhibits exposure to a source of energy of the area above and in line with said floating gate, with a significant overlap or extending beyond the limits of said floating gate, said inhibition of exposure to occur upon inter-positioning of said pattern between said source of energy and said first layer of photoresist, thereby creating a first photoresist pattern.

17. The method of claim 13 wherein said etching said first layer of photoresist is removing said first layer of photoresist in accordance with said first photoresist pattern.

18. The method of claim 13 wherein said depositing a layer of CVD oxide is depositing a layer of CVD oxide over said first photoresist pattern further depositing said CVD oxide over said layer of tunneling oxide whereby the top surface of said layer of CVD oxide is planarized after deposition.

19. The method of claim 13 wherein said depositing a second layer of photoresist is depositing a layer of photoresist on top of said layer of CVD oxide.

20. The method of claim 13 wherein said patterning and etching said second layer of photoresist is: creating a pattern that does not inhibit exposure to a source of energy of the area above and in line with the source and drain regions of said floating gate and the source and drain regions of surrounding active devices, said lack of inhibition of exposure to occur upon inter-positioning of said pattern between said source of energy and said second layer of photoresist, said patterning to be followed by etching of said second layer of photoresist in accordance with said pattern, thereby creating a second photoresist pattern.

21. The method of claim 13 wherein said etching said layer of CVD oxide is etching said layer of CVD oxide in accordance with the second photoresist pattern thereby creating openings in said CVD oxide layer for the implantation of source and drain regions.

22. The method of claim 2 wherein said removing said etched photoresist is removing the photoresist in areas on the surface of said thin layer of screen oxide that have not previously been removed by said patterning and etching of said layer of photoresist thereby creating a clean surface of said substrate.

23. A method for manufacturing a multilayer polysilicon device including peripheral transistors, said method comprising the steps of:

securing a semiconductor substrate;

forming shallow trench isolation (STI) regions within the surface of said substrate;

depositing a thin layer of screen oxide over the surface of said substrate;

depositing a first layer of photoresist over said layer of screen oxide;

patterning said first layer of photoresist;

etching said first layer of photoresist;

doping the surface of said substrate;

removing said etched first layer of photoresist;

removing said thin layer of screen oxide;

performing a high temperature oxide (HTO) deposition on the surface of said substrate thereby forming interpoly dielectric thereby further forming peripheral gate oxide;

performing a high temperature oxide annealing of said gate oxide thereby improving the interpoly dielectric furthermore improving said peripheral gate oxide;

implantation of dopant thereby further activating a control gate implant;

depositing a layer of polysilicon on top of said HTO deposition;

depositing a second layer of photoresist on top of said layer of polysilicon;

patterning and etching said second layer of photoresist;

dry etching said layer of polysilicon including said interpoly dielectric further including said peripheral gate oxide;

performing a dry oxidation of said layer of polysilicon and said HTO;

depositing a layer of undoped polysilicon overlaying said layer of polysilicon furthermore overlaying said peripheral gate oxide;

depositing a third layer of photoresist over said undoped polysilicon;

patterning and etching said third layer of photoresist;

depositing a layer of CVD oxide over said patterned third layer of photoresist furthermore overlaying said peripheral gate oxide;

depositing a fourth layer of photoresist;

patterning and etching said fourth layer of photoresist;

etching said layer of CVD oxide; and performing source and drain implant.

24. The method of claim 23 wherein said shallow trench isolation regions are adjacent and functionally related STI regions.

25. The method of claim 23 wherein said patterning said first layer of photoresist is: creating a pattern, wherein said first photoresist pattern approximately overlaying such that said STI regions and their intra-STI areas will be exposed upon inter-positioning of said pattern between a source of exposure and said first layer of photoresist, thereby creating a first photoresist pattern.

26. The method of claim 23 wherein said etching said first layer of photoresist is: removing said first photoresist from the surface of said thin layer of screen oxide, said removing to occur in the areas of said first photoresist that are approximately above and align with adjacent and functionally related STI areas, furthermore said removing to occur above the intra-STI areas of said adjacent and functionally related intra-STI areas.

27. The method of claim 23 wherein said doping the surface of said substrate is: implanting of antimony at a dose in the range of $1 \times 10^{15}$ to $1 \times 10^{16}$ atoms/cm$^2$ and an energy in the range of 200 to 250 kilo-electron volts, said doping to proceed over a period of time between 300 and 360 seconds, thereby creating a control gate consisting of an intra-STI region of n-doped silicon material, said region extending into said substrate surface to a depth considerably less than the depth of said STI regions.

28. The method of claim 27 wherein said performing a high temperature oxide deposition is: a deposition and annealing at between 800 and 900 degrees C. of a layer of oxide on the surface of said substrate, thereby forming the interpoly dielectric for said multilayer polysilicon device, thereby further forming the dielectric for said peripheral transitors, thereby furthermore activating said antimony dopants.

29. The method of claim 23 wherein said removing said etched first photoresist is removing the photoresist in areas on the surface of said thin layer of screen oxide that have not previously been removed by said patterning and etching of said first layer of photoresist thereby creating a clean surface of said substrate.

30. The method of claim 23 wherein said patterning of said second layer of photoresist is: creating a pattern, whereby said second photoresist is overlaying said control gate, furthermore partially overlaying said STI regions adjacent to and functionally related to said control gate.

31. The method of claim 23 wherein said etching said second layer of photoresist is: creating a pattern of photoresist above and in line with said control gate, said pattern further partially extending over each of said STI regions adjacent to and functionally related with said control gate, thereby creating a second pattern of photoresist on top of said layer of polysilicon.

32. The method of claim 23 wherein said dry etching said layer of polysilicon is: etching in accordance with said pattern of photoresist on top of said layer of polysilicon, thereby creating a pattern of polysilicon above and in line with said control gate with sloping sides, s aid sloping sides extending beyond the vertical dimensions of said control gate, thereby further removing said pattern of photoresist on top of said layer of polysilicon, thereby creating the floating gate of the multilayer polysilicon device.

33. The method of claim 32 wherein said performing a dry oxidation of said layer of polysilicon is: forming a thin layer of tunneling oxide, said tunneling oxide overlaying said pattern of polysilicon, furthermore overlaying said peripheral gate oxide.

34. The method of claim 33 wherein said depositing a layer of undoped polysilicon is depositing a layer of undoped polysilicon on the surface of said layer of tunneling oxide.

35. The method of claim 33 wherein said depositing a layer of CVD oxide is: depositing a layer of CVD oxide over said third photoresist pattern, further depositing said CVD oxide over said layer of tunneling oxide, whereby the top surface of said layer of CVD oxide is planarized after deposition.

36. The method of claim 23 wherein said depositing a third layer of photoresist is depositing a layer of photoresist on top of said layer of undoped polysilicon.

37. The method of claim 23 wherein said patterning said third layer of photoresist is: creating a pattern that inhibits exposure to a source of energy of the area above and in line with said floating gate with a significant overlap or extending beyond the limits of said floating gate, said inhibition of exposure to occur upon inter-positioning of said pattern between said source of energy and said third layer of photoresist, thereby creating a third photoresist pattern.

38. The method of claim 23 wherein said etching said third layer of photoresist is removing said third layer of photoresist in accordance with said third photoresist pattern.

39. The method of claim 23 wherein said depositing a fourth layer of photoresist is depositing a layer of photoresist on top of said layer of CVD oxide.

40. The method of claim 23 wherein said patterning and etching said fourth layer of photoresist is: creating a pattern that does not inhibit exposure to a source of energy of the areas above and in line with the source and drain regions of said floating gate and the source and drain regions of surrounding active devices, said lack of inhibition of exposure to occur upon inter-positioning of said pattern between said source of energy and said fourth layer of photoresist, said patterning to be followed by etching of said fourth layer of photoresist in accordance with said fourth pattern, thereby creating a fourth photoresist pattern.

41. The method of claim 23 wherein said etching said layer of CVD oxide is: etching said layer of CVD oxide in accordance with the fourth photoresist pattern, thereby creating openings in said CVD oxide layer for the implantation of source and drain regions.

* * * * *